US005786707A

United States Patent [19]

Hayama et al.

[11] Patent Number: 5,786,707

[45] Date of Patent: Jul. 28, 1998

[54] METHOD OF DETECTING POSSIBLE DEFECT OF LIQUID CRYSTAL PANEL

[75] Inventors: Takafumi Hayama, Ibaraki; Katsumi Irie, Kashihara, both of Japan

[73] Assignee: Sharp Kabushiki Kaisha, Osaka, Japan

[21] Appl. No.: 762,155

[22] Filed: Dec. 9, 1996

[30] Foreign Application Priority Data

Dec. 7, 1995 [JP] Japan .................................... 7-319314

[51] Int. Cl.[6] .................................................. G01R 31/00

[52] U.S. Cl. ............................................................ 324/770

[58] Field of Search ............................... 324/770; 349/54, 349/192; 345/87, 206

[56] References Cited

U.S. PATENT DOCUMENTS

| | | | |
|---|---|---|---|
| 3,816,113 | 6/1974 | Haas et al. | 430/20 |
| 3,842,275 | 10/1974 | Haas et al. | 250/331 |
| 3,954,653 | 5/1976 | Yamazaki | 252/299.66 |
| 3,979,321 | 9/1976 | Couttet et al. | 252/299.5 |
| 4,137,192 | 1/1979 | Matsufuji | 252/299.5 |
| 4,173,545 | 11/1979 | Beguin et al. | 252/299.64 |
| 4,340,498 | 7/1982 | Sugimori | 252/299.5 |
| 5,027,111 | 6/1991 | Davis et al. | 340/784 |
| 5,066,107 | 11/1991 | Yoshinaga et al. | 349/183 |
| 5,113,134 | 5/1992 | Plus et al. | 324/770 |
| 5,377,030 | 12/1994 | Suzuki et al. | 324/770 |
| 5,465,053 | 11/1995 | Edwards | 324/770 |
| 5,506,516 | 4/1996 | Yamashita et al. | 324/770 |
| 5,528,163 | 6/1996 | Takahashi | 324/770 |
| 5,532,615 | 7/1996 | Kondo et al. | 324/770 |
| 5,608,558 | 3/1997 | Katsumi | 349/192 |

*Primary Examiner*—Ernest F. Karlsen
*Assistant Examiner*—Anh Phung
*Attorney, Agent, or Firm*—Nixon & Vanderhye P.C.

[57] ABSTRACT

In the case where a possible defect of a liquid crystal panel is detected, after the liquid crystal panel is put into an oven with the liquid crystal panel being energized, a second inspecting pulse, which has a larger potential difference than a potential difference of a first inspecting pulse applied to a second signal line on an active matrix substrate, is applied to a second signal line. In the above method, since an insulating layer, which is on the verge of breakage, between a source line and the second signal line can be broken, a possible defect of the liquid crystal panel can be detected as a cross bright line by inspection for turning-on in the panel inspecting step. For this reason, in this method, accuracy of detecting a possible defect can be improved, and the number of S-G leaks in the market is decreased greatly, thereby improving display quality of the liquid crystal panel.

14 Claims, 7 Drawing Sheets

METHOD OF DETECTING POSSIBLE DEFECT OF LIQUID CRYSTAL PANEL

FIELD OF THE INVENTION

The present invention relates to a method of detecting a possible defect of the liquid crystal panel which detects a possible place to be defective on an active matrix substrate of a liquid crystal panel.

BACKGROUND OF THE INVENTION

An active matrix substrate is composed of a plurality of gate lines, a plurality of source lines, each active element, and picture element electrodes which are arranged in a matrix pattern. The gate lines, the source lines, each active element, and the picture element electrodes are provided on a transparent insulating substrate made of glass, etc. The source lines intersect the gate lines respectively. Each active element drives each picture element which is positioned on each intersected portion of each gate line and each source line. The picture element has a picture element electrode, a counter electrode and liquid crystal which is sandwiched therebetween. The picture element electrode is connected to the gate line and the source line through the active element.

On the market at present, various defective modes due to a panel occurs on a liquid crystal panel having an active matrix substrate. The most serious mode to be eliminated of these defective modes is cross bright line mode caused by a leak between a source line and a gate line (i.e. S-G leak).

In other words, an insulating layer is normally provided between the source line and the gate line so that the space between both the lines are insulated completely. However, sudden abnormality might occur on the thin layer when forming various thin layers of the active matrix substrate. If the abnormality occurs on the insulating layer where the source line and the gate line intersect each other, this abnormality induces an S-G leak, and a defect as a cross luminescent line occurs.

In this case, there arises a problem of degree of breakage of the insulating layer between the source line and the gate line. If the insulating film is broken completely, a defect of a liquid crystal panel as a cross luminescent line can be detected at the step of inspecting turning-on of the panel in the process of inspecting the liquid crystal panel. However, if the degree of the breakage is small and the insulation between the source line and the gate line is very small, a defect of a liquid crystal panel cannot be detected in the step of inspecting the panel. In this case, after a finished module to which the liquid crystal panel was mounted is shipped, an insulating layer breaks due to electrical stress as it ages in the market, an S-G leak newly occurs on the liquid crystal panel.

Conventionally, in order to prevent such a situation, a certain method has been adopted for inspecting a defect before shipping of a liquid crystal panel. In this method, stress is applied to an insulating layer between a source line and a gate line, and the insulating layer, which cannot withstand long-time use and is on the verge of breakage, is broken completely so that a potentially defective portion is detected in advance. Here, such a method is referred to as an S-G debug method, and such a process is referred to as S-G debug.

The conventional S-G debug method is roughly divided into two methods. One is an overvoltage applying method, in which a voltage larger than a normal inspection driving voltage is applied temporarily. The other method is a high temperature current-carrying light aging method. In this method, a liquid crystal panel is put into a high-temperature tank for a specific period with the liquid crystal panel being energized.

As shown in FIG. 7, conventionally, the high temperature current-carrying light aging method and the overvoltage applying method are separately used for inspecting a defect.

The S-G debug by the overvoltage applying method is executed in the panel inspecting step (P11) before a liquid crystal panel is mounted to a module. The S-G debug by the high temperature current-carrying light aging method is executed in the module inspecting step (P13) after a liquid crystal panel is mounted to a module (P12).

However, even in detection of a possible defect by the conventional two steps, i.e. the overvoltage applying method and the high temperature current-carrying light aging method, the detecting accuracy is hardly sufficient. Therefore, these methods cannot greatly decrease the number of the S-G leaks in which appear the market.

Namely, in both the S-G debug by the overvoltage applying method and the S-G debug by the high temperature current-carrying light aging method, insufficient stress is applied to an insulating layer between a source line and a gate line. For this reason, the probability is low that a defect on the active matrix substrate can be detected as a cross luminescent line by the conventional panel inspection and module inspection. Therefore, the number of the S-G leaks on liquid crystal panels having the active matrix substrate could not be lowered in the market.

SUMMARY OF THE INVENTION

It is an object of the present invention to improve detecting accuracy of a possible defect on a liquid crystal panel and greatly decrease a number of defects due to a panel such as S-G leak in the market.

In order to achieve the above object, in accordance with one aspect of the present invention, a method of detecting a possible defect of a liquid crystal panel, provided with a substrate, which has active elements for driving a picture element with liquid crystal, first signal lines (source lines) and second signal lines (gate lines) which intersect each other and control the active elements, and an insulating layer provided between the source lines and the gate lines, includes the step of retaining the liquid crystal panel under a high temperature condition while the liquid crystal panel is being energized by a first inspecting pulse, and the step of applying a second inspecting pulse having a larger potential difference than the first inspecting pulse to at least either of the source lines and the gate lines under the high temperature condition temporarily.

In addition, voltage value settings, period and the period during which the voltage is applied, and the number of times the second inspecting pulse is applied may be set so that a voltage value, at which normal active elements, which are driven by each line on the active matrix substrate after the process under each condition, are broken, becomes larger than a normal driving voltage value of the liquid crystal panel having the active matrix substrate.

In accordance with the above method, when the liquid crystal panel having the active matrix substrate is retained under the high temperature condition with the first inspecting pulse being applied to the liquid crystal panel, and at the same time the second inspecting pulse, which is larger than the normal first inspecting pulse, is applied to the gate line, for example, temporarily, stress is applied to the insulating layer which is brought into contact with the gate line.

Thereafter, the insulating layer, which cannot withstand use, is broken so that a possible defect on the active matrix substrate is detected.

Therefore, unsatisfactory insulation between the source line and the gate line, namely, a possible defect which will develop into an S-G leak, for example, can be detected.

Furthermore, in the case where the liquid crystal panel is a Cs-on-Common type having an auxiliary capacitance which is electrically insulated from the picture element electrode by the insulating layer, when the second inspecting pulse is applied to not only the gate line but also the auxiliary capacitance line, a possible defect caused by unsatisfactory insulation between the picture element electrode and the auxiliary capacitance line on the active matrix substrate can be detected. As a result, the accuracy of detecting a possible defect is improved, and thus a number of unsatisfactory operations, such as S-G leaks in the market can be decreased greatly.

In addition, by setting each condition of the voltage value, applying period and the number of applying times of the second inspecting pulse as mentioned above, a problem caused by excessive stress is being applied to a normal insulating layer which is brought into contact with each line to which the second inspecting pulse was applied can be avoided.

Compared with the case where the conventional inspecting method is provided into the panel inspecting step and the module inspecting step so that the S-G debug is executed by the overvoltage applying method and the high temperature current-carrying aging method, the above method requires only one S-G debug, thereby shortening a total time required for inspecting a defect.

According to the above method, when the above inspection is executed after the liquid crystal panel is mounted into the module, the applying voltage value of the module substrate and IC (Integrated Circuit) exceeds its allowable value, and thus the module substrate and the IC might be broken. Therefore, it is necessary to inspect the liquid crystal panel for a possible defect in the panel inspecting step before the mounting to the module.

For fuller understanding of the nature and advantages of the invention, reference should be made to the ensuing detailed description taken in conjunction with the accompanying drawings.

BRIEF DESCRIPTION OF THE DRAWINGS

FIG. 5(*b*) is a timing chart which explains waveforms of a second source line signal and a gate line signal which are outputted from a second source line signal generating circuit in the inspecting circuit.

FIG. 5(*c*) is a timing chart which explains waveforms of a third source line signal and a gate line signal which are outputted from a third source line signal generating circuit in the inspecting circuit.

DETAILED DESCRIPTION OF THE PREFERRED EMBODIMENTS

The following describes one embodiment of the present invention.

First, the description will be given as to a structure of, for example, a Cs-on-Common-type liquid crystal panel to be inspected for a defect.

Figure 1:
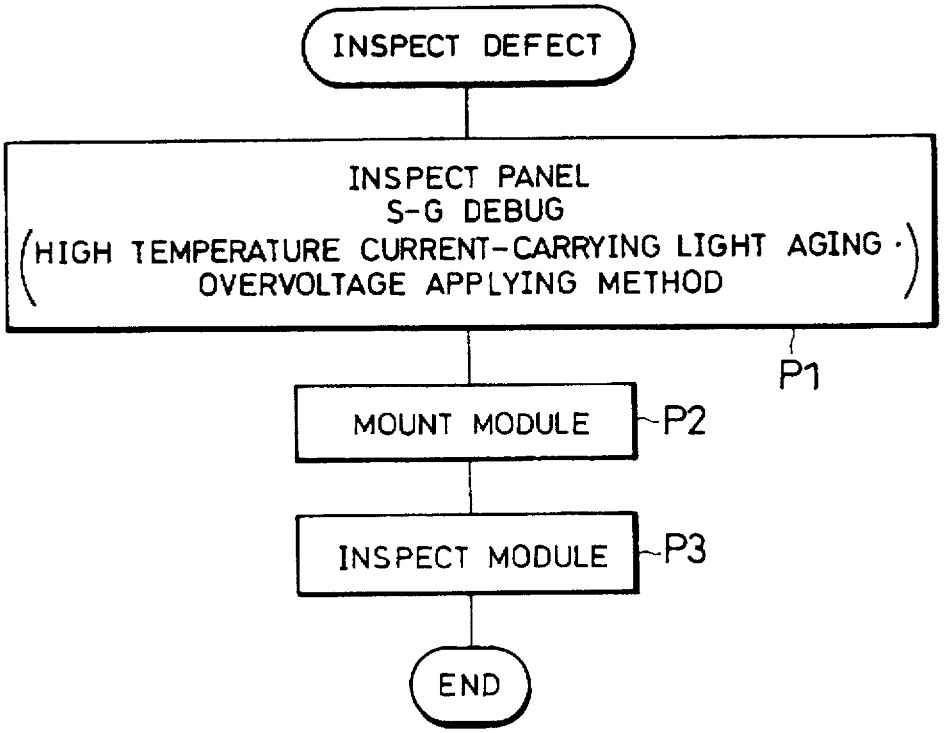
FIG. 1 shows one embodiment of a method of detecting a possible defect of a liquid crystal panel of the present invention, and is a flow chart which shows each step of the detecting method.
Figure 2:
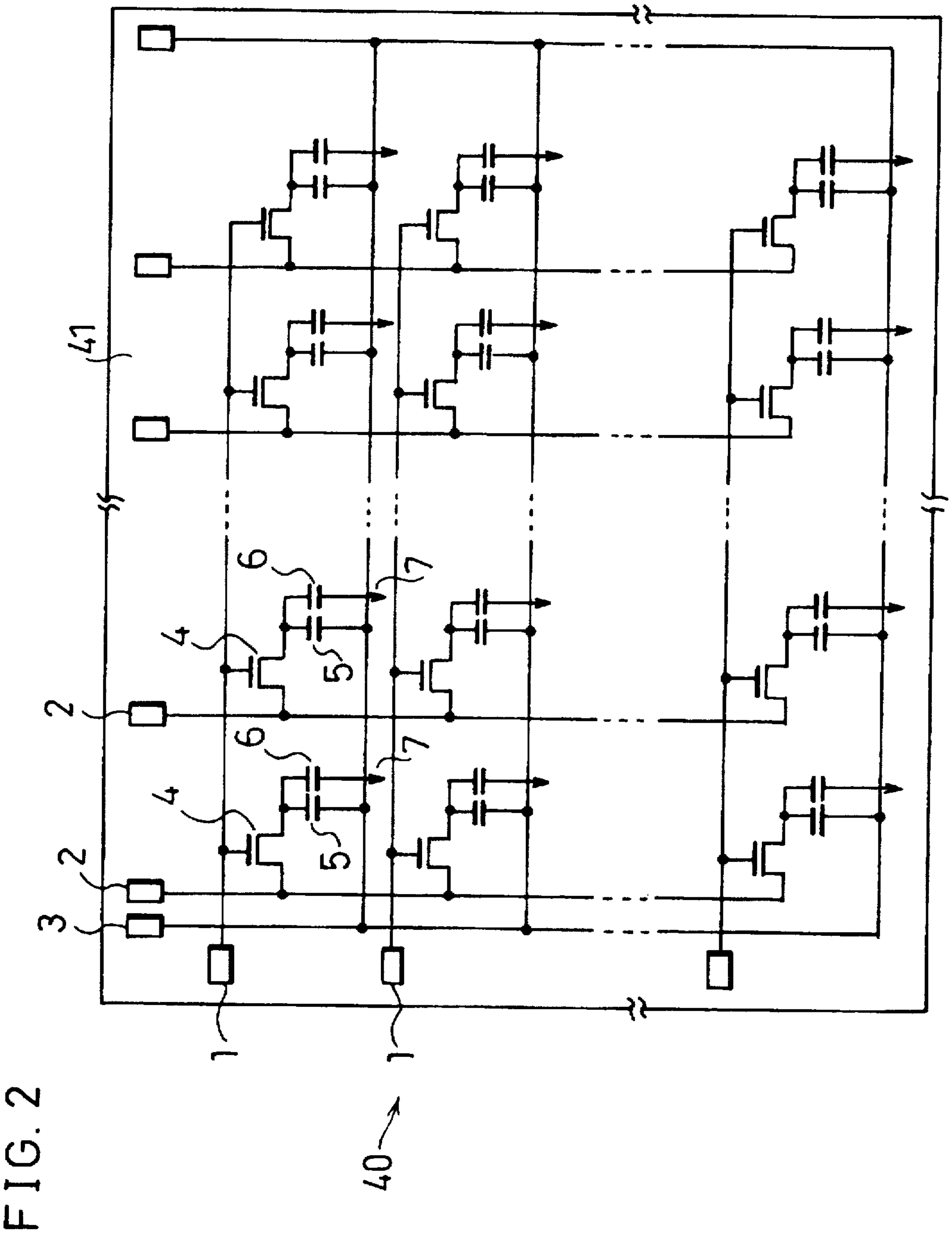
FIG. 2 is a circuit diagram of a whole active matrix substrate of Cs-on-Common-type liquid crystal panel.
Figure 3:
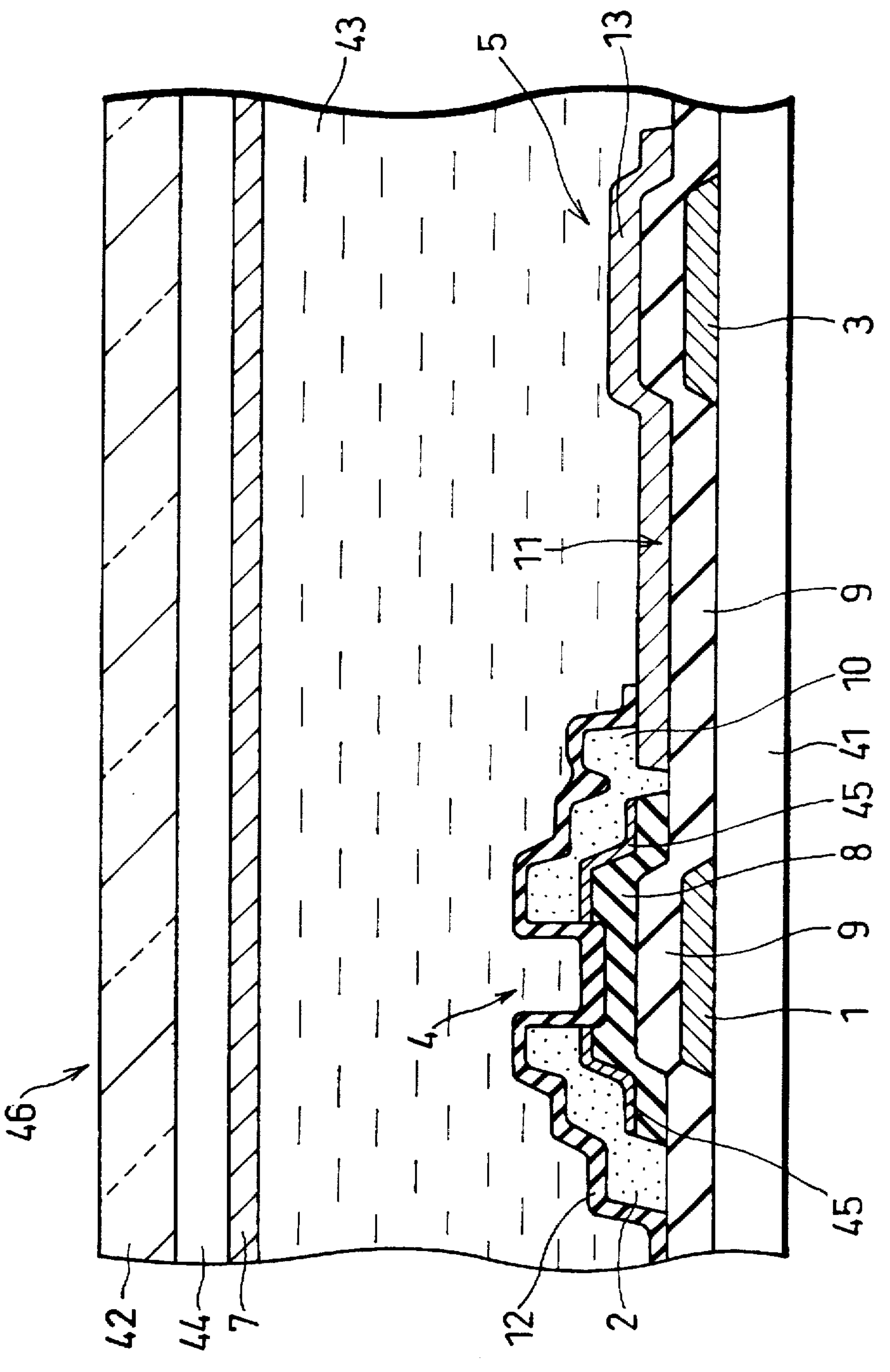
FIG. 3 is a longitudinal cross sectional view of a thin-film-transistor-type switching element on the active matrix substrate of the Cs-on-Common-type liquid crystal panel.

As shown in FIGS. 2 and 3, the above liquid crystal panel has an active matrix substrate 40. The active matrix substrate 40 is provided with two transparent and insulating substrates 41 and 42. Liquid crystal 43 is sandwiched between the substrates 41 and 42. Each picture element 46 is formed in a matrix pattern. A plurality of gate lines (second signal lines) 1 and a plurality of source lines (first signal lines) 2, which drive TFT 4 and are arranged at parallel distances, are provided to the substrate 41. The gate line 1 intersects the source line 2 perpendicularly.

Thin film transistors (i.e. TFT) 4, which are active elements for driving each picture element 46, are respectively provided in cross sections of the gate lines 1 and the source lines 2 on the substrate 41. Moreover, a liquid crystal capacitor 6 is connected to an auxiliary capacitor 5 on the output side of the TFT 4.

The liquid crystal capacitor 6 is connected also to a counter electrode 7. The auxiliary capacitor 5 is connected also to a Cs line 3. The Cs line 3 is formed commonly for all the picture elements 46, and a common signal, which is the same as a common signal applied to the counter electrode 7, is applied to the Cs line 3. The provision of the auxiliary capacitors 5 and the Cs line 3 makes it possible to obtain stable display on the liquid crystal panel. Moreover, a color filter 44 is provided between the active matrix substrate 40 and the counter electrode 7.

The TFT 4 is provided in the proximity of the cross section of the gate line 1 and the source line 2, and it has a semiconductive layer 8 made of a—Si, etc. The semiconductive layer 8 is formed on the gate line 1 with an insulating film 9 being put therebetween. $SiO_2$ or SiN is used as a material of the insulating film 9.

Both the ends of the semiconductive layer 8 are connected respectively to the source line 2 and a drain 10. Moreover, the semiconductive layer 8 is formed so that its middle section, which faces the gate line 1, becomes a channel domain. A semiconductive layer 45 made of $n^+$a—Si for ohmic contact, for example, is formed respectively between the semiconductive layer 8 and the source line 2 and between the drain 10 and the semiconductive layer 8. The drain 10 is connected to a picture element electrode 11. The TFT 4 is covered with an insulating film 12.

When an ON voltage (scanning voltage), which makes a gate line signal positive with respect to GND, is applied to the TFT 4, the TFT 4 is brought into the ON state in which the conducting state is obtained between the source line 2 and the drain 10.

The Cs lines 3 are respectively arranged between the adjacent gate lines 1, and they are formed on the substrate 41. The gate lines 1 are provided to the layer where the Cs lines 3 are formed.

In addition, an auxiliary capacitor electrode 13 (i.e. Cs electrode) as a part of the picture element electrode 11 is formed on the Cs line 3 with the insulating film 9 being sandwiched between the Cs line 3 and the auxiliary capacitor electrode 13. The auxiliary capacitor 5 is composed of the Cs line 31 the Cs electrode 13, and the insulating film 9 which is sandwiched therebetween. Such a structure of the liquid crystal panel having the auxiliary capacitors 5 is the Cs-on-Common structure.

The following describes an arrangement of an inspecting apparatus which is used for inspection a defect and adopts the method of detecting a possible defect of the liquid crystal panel according to the present invention.

Figure 4:
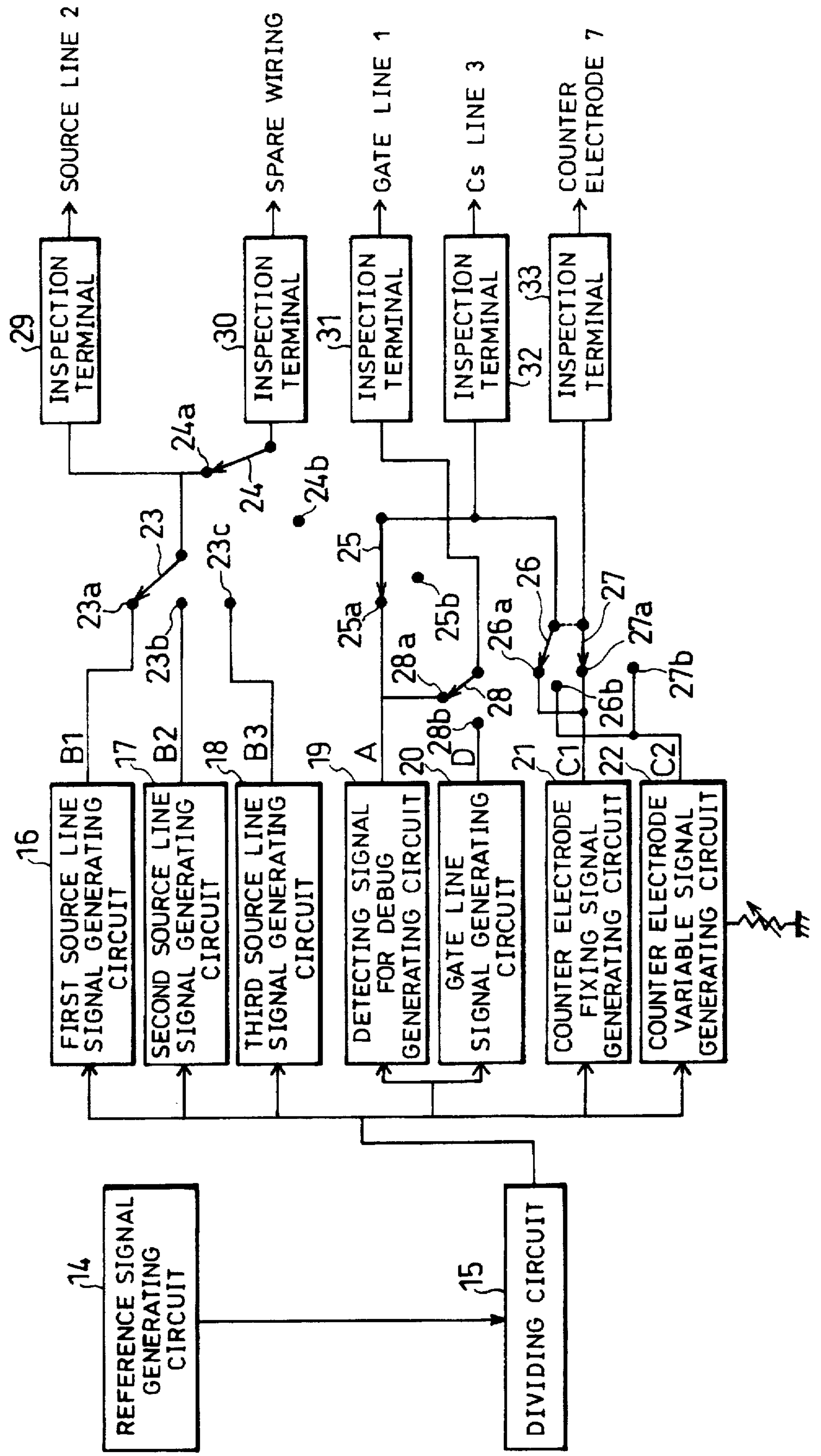
FIG. 4 is a block diagram which shows a configuration of an inspecting circuit of an inspecting apparatus which is used for a liquid crystal panel inspecting step in the detecting method.

The inspection apparatus is provided with an inspecting circuit shown in the block diagram of FIG. 4. The inspecting circuit is composed of a reference signal generating circuit 14, a dividing circuit 15, seven signal generating circuits 16 through 22 for inputting output signals from the dividing circuit 15 thereinto, six switches 23 through 28, and five inspection terminals 29 through 33. The seven signal circuits are first through third source line signal generating circuits 16 through 18, a debug detecting signal generating circuit 19, a gate line signal generating circuit 20, a counter electrode fixing signal generating circuit 21 and a counter electrode variable signal generating circuit 22.

The first through third source line signal generating circuits 16 through 18 respectively generate first through third source line signals B1 through B3. Moreover, the outputs from the first through third source line signal generating circuits 16 through 18 are supplied respectively to terminals 23a through 23c of the switch 23. The switch 23 applies the outputs from the first through third source line signal generating circuits 16 through 18 to the source lines 2 through the inspection terminal 29 by selectively switching a terminal between the terminals 23a through 23c.

Figures 5A, 5B, 5C:
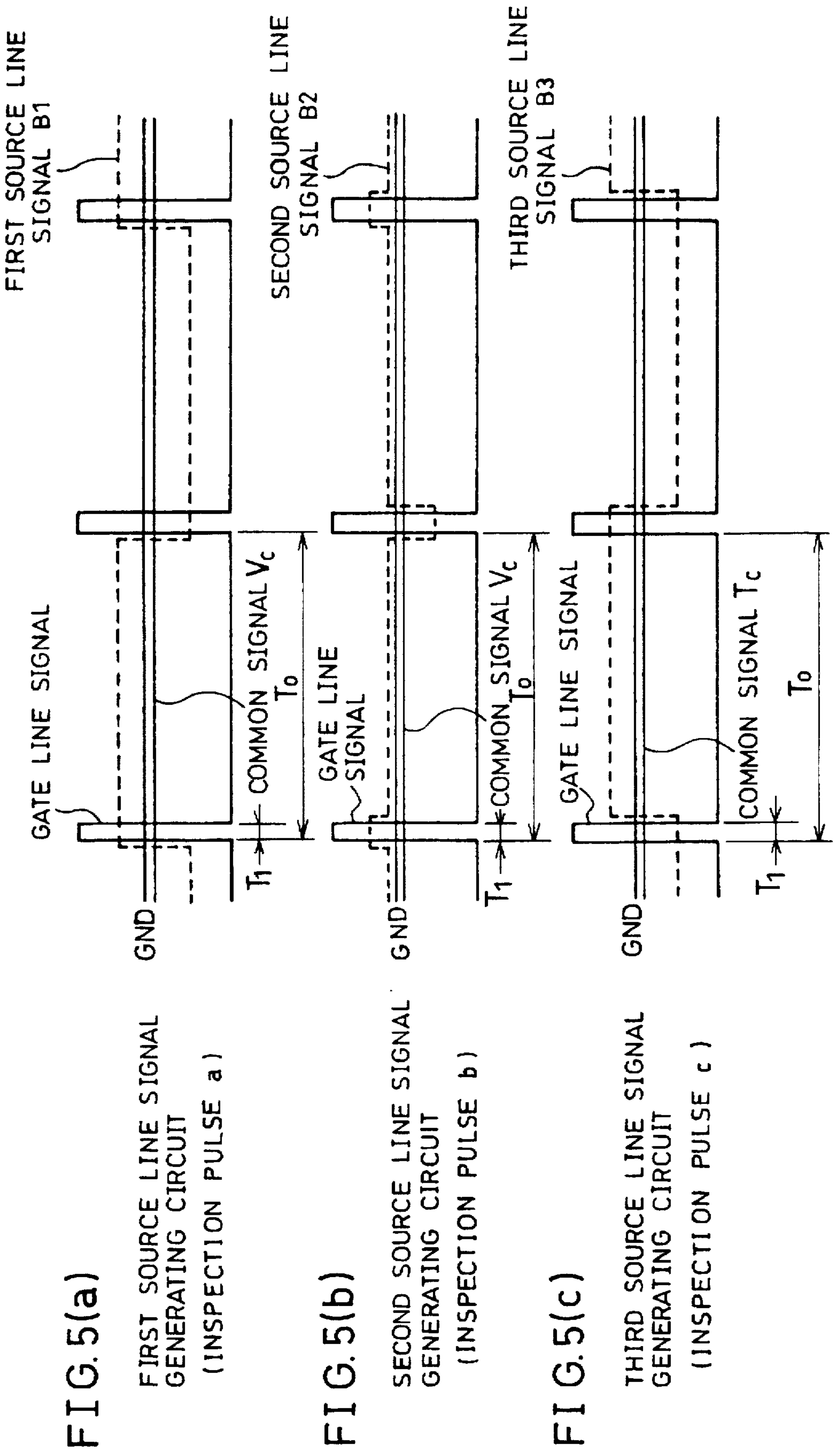
FIG. 5(*a*) is a timing chart which explains waveforms of a first source line signal and a gate line signal which are outputted from a first source line signal generating circuit in the inspecting circuit.

As shown in FIGS. 5(*a*), 5(*b*) and 5(*c*), inspecting pulses a through c for inspecting the liquid crystal panel are set so that timing of rising and falling of the first through third source line signals B1 through B3 are different from gate line signals.

Since it is necessary for the first through third source line signals B1 through B3 to drive the liquid crystal 43 by AC, the first through third source line signals B1 through B3 are inverted per constant period $T_0$ with respect to the center line of a potential $V_c$ of the common signal. The potential Vc of the common signal is set according to an offset voltage, which is generated when the TFT 4 is off, so as to be lower than a potential of GND of the liquid crystal panel.

The inspecting pulse a is used for inspecting a rising characteristic of each TFT 4 (see FIG. 5(*a*)). As to the inspecting pulse a, just before the TFT 4 is on, the first source line signal B1 to be applied to the source line 2 is previously changed into positive or negative with respect to the GND by a gate line signal which is at high level during a period T, which is 1/5 to 1/10 the period $T_0$.

When the gate line signal is at high level, a potential according to the signal B1 is applied to the picture element electrode 11, and when the gate line signal is at low level, the potential is maintained.

The inspecting pulse a can inspect a state that the gate line signal is at high level and the TFT 4 shifts from the OFF state to the ON state, thereby inspecting the rising characteristic of the TFT 4.

The inspecting pulse b is used for inspecting as to how much a drain current (electric charge), which flowed to the picture element electrode 11 by the TFTs 4, can be maintained by a function of the auxiliary capacitor 5 even when the TFTs 4 are at off state (Vgl) (see FIG. 5(*b*)).

For this reason, the inspecting pulse b changes the second source line signal B2 from the substantially same potential as the GND to a plus potential or a minus potential according to the period $T_1$ for which the gate line signal is at high level.

As to the inspecting pulse b, in the case of, for example, a leak between the picture element electrode 11 and the source line 2, the drain current as well as the second source line signal B2 leaks from the picture element electrode 11, and the potential of the picture element electrode 11 is lowered, and thus a point defect occurs on a display screen of the liquid crystal panel.

The inspecting pulse c is used for inspecting the falling characteristic of each TFT 4 (see FIG. 5(*c*)). Just after the period $T_1$ for which the gate line signal is at high level, the inspecting pulse c changes the third source line signal B3 to be applied to the source line 2 to plus or minus with respect to the GND. The inspecting pulse c can inspect a state that the gate line signal is at low level and the TFT 4 shifts from ON state to OFF state, thereby inspecting the falling characteristic of the TFT 4.

Meanwhile, since it is necessary that the liquid crystal panel is driven by AC, the first source line signal Be, the second source line signal B2 and the third source line signal B3 shown in FIGS. 5(*a*), 5(*b*) and 5(*c*) are inverted by AC per constant period with respect to the center line of a potential of the common signal.

In addition, the outputs from the first through third source line signal generating circuits 16 through 18 selected by the switch 23 are supplied also to a terminal 24a of the switch 24. The switch 24 supplies the outputs to a preliminary wiring through the inspection terminal 30 by selecting the terminal 24a. Meanwhile, when the terminal 24b is selected, the outputs are not supplied to the preliminary wiring.

The debug detecting signal generating circuit 19 generates a debug detecting signal A of the second inspecting pulse. The output from the debug detecting signal generating circuit 19 is supplied to a terminal 28a of the switch 28 and a terminal 25a of the switch 25. The gate line signal generating circuit 20 generates a gate line signal D for the gate line 1. The output from the gate line signal generating circuit 20 is supplied to a terminal 28b of the switch 28.

The switch 28 applies the gate line signal D, which is the output of the gate line signal generating circuit 20, to the gate line 1 through the inspection terminal 31 by selecting the terminal 28b. Meanwhile, the switch 28 applies the debug detecting signal A (second inspecting pulse), which is the output of the debug detecting signal generating circuit 19, to the gate line 1 through the inspection terminal 31 by selecting the terminal 28a.

Figure 6:
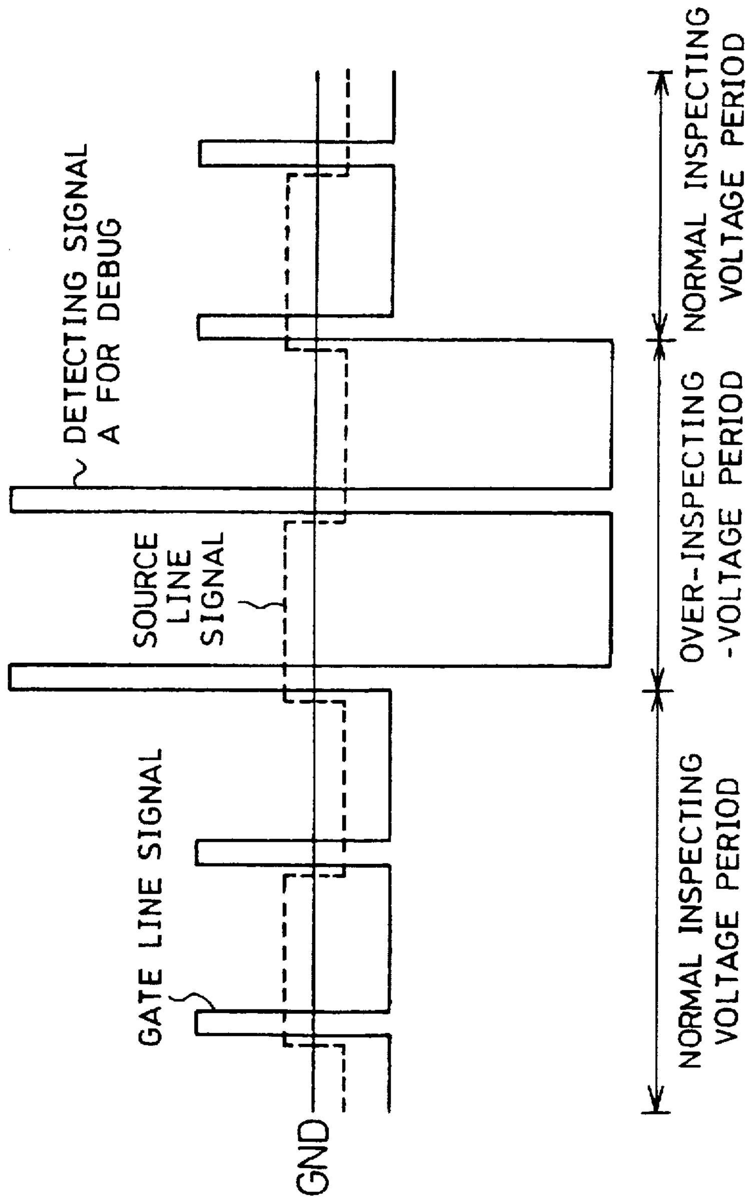
FIG. 6 is a timing chart which shows driving waveforms of each gate line signal and source line signal when S-G debug in the panel inspecting step is executed.
Figure 7:
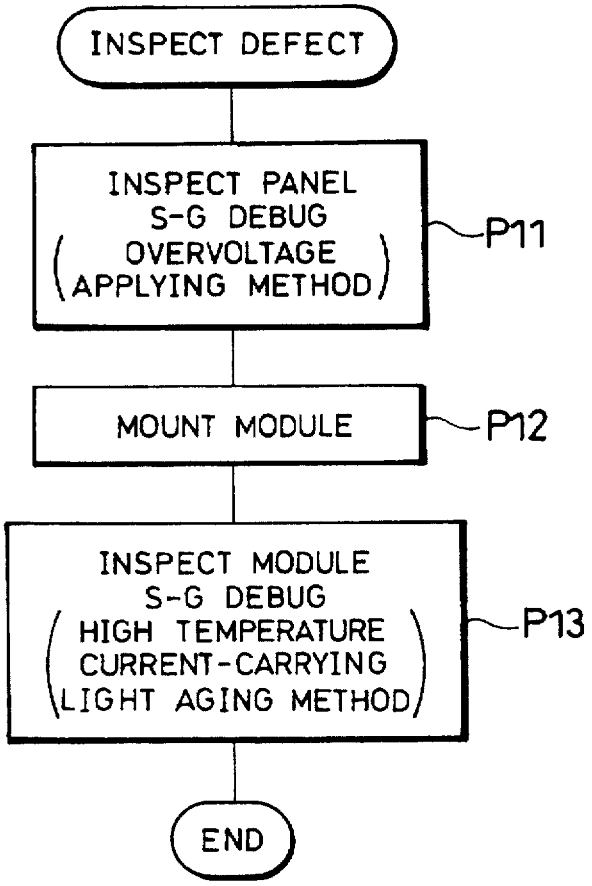
FIG. 7 is a flow chart which shows each conventional step of inspecting a defect on a liquid crystal panel and a liquid crystal module.

As shown in FIG. 6, the debug detecting signal A is set so that a potential difference between the maximum value and the minimum value of the gate line signal in the inspecting pulse a becomes large. The switch 25 applies the debug detecting signal A also to the Cs line 3 through the inspection terminal 32 by selecting the terminal 25a. Meanwhile, when the terminal 25b is selected, the switch 25 does not apply the debug detecting signal A to the Cs line 3.

The counter electrode fixing signal generating circuit 21 generates a fixed signal (common signal) C1. Moreover, the fixed signal C1 is fixed to a counter electrode voltage value which is the most suitable for display on the liquid crystal panel without flicker. The output from the counter electrode fixed signal generating circuit 21 is outputted to a terminal 26*a* of the switch 26 and a terminal 27*a* of the switch 27. Moreover, the counter electrode variable signal generating circuit 22 generates a variable signal C2, and the variable signal C2 can be varied until a voltage which turns the TFT 4 on. The output from the counter electrode variable signal generating circuit 22 is outputted to a terminal 26*b* of the switch 26 and a terminal 27*b* of the switch 27.

The switch 26 applies the fixed signal C1 to the Cs line 3 through the inspection terminal 32 by selecting the terminal 26*a*. Meanwhile, when the terminal 26*b* is selected, the variable signal C2 is applied to the Cs line 3 through the inspection terminal 32.

In addition, the switch 27 applies the fixed signal C1 to the counter electrode 7 through the inspection terminal 33 by selecting the terminal 27*a* of the switch 27. Meanwhile, when the terminal 27*b* is selected, the switch 27 applies the variable signal C2 to the counter electrode 7 through the inspection terminal 33.

The switches 23 through 28 are controlled by a control circuit, not shown, and the switches 26 and 27 are linked.

The following describes defect inspection of the liquid crystal panel using the above-mentioned inspecting apparatus.

The inspecting apparatus is used for the step P1 of inspecting the liquid crystal panel, and the S-G debug of the present invention is executed in the step of inspecting the liquid crystal panel.

First, a temperature of an oven (not shown), for example, is set to about 60° C., and its humidity is set to "dry" so as to establish a relative humidity not more than 40%RH. The temperature of the oven may be set to such a value that a defective characteristic does not occur in the satisfactory TFT 4 for each type of the liquid crystal panel, so it is not particularly limited. However, it is preferable that the temperature falls within the range between more than room temperature and less than the upper limit of the mesomorphic range in the liquid crystal 43, namely, the range of 40° C. to 80° C., for example. Moreover, it is more preferable that the temperature falls within the range of 50° C. to 70° C.

The active matrix substrate 40 is set on a substrate, not shown, of the inspecting apparatus so as to be energized, and the active matrix substrate 40 is put into the oven for aging. During the aging, the gate line signal to be the inspecting pulse a is normally applied to the gate line 1 (normal inspecting voltage period). Then, the debug detecting signal A is applied to the gate line 1 for one second which is a several cyclic period (over-inspecting-voltage), and then it is returned to the inspecting pulse a immediately. This process is repeated several times.

FIG. 6 shows the waveform at the time of the S-G debug. The first source line signal B1 is applied to the source line 2. The voltage of the debug detecting signal A may fall within the maximum gate-source voltage ($V_{GS\ max}$) of the TFT 4, but it is preferable that the voltage is 75 to 95% of $V_{GS\ max}$, and more preferable that the voltage is 80 to 90% of $V_{GS\ max}$. Moreover, as to another setting, for example, when the normal gate line signal (first inspecting pulse) to be applied to the gate line 1 is such that Vgh=α(V) and Vgl=−β(V), the debug detecting signal A is set, for example, as Vgh=about 2α (V) and Vgl=about −4β(V). The above set signal A is applied to the gate line 1 for about one second.

The accurate voltage value, applying period, and number of applying times of the signal A may be set to such values that a defective characteristic does not occur on the satisfactory TFT 4 for each type of liquid crystal panels, so the values can be set as follows.

Namely, stress is applied to the insulating film 9 between the gate line 1 and the source line 2 in the liquid crystal panel according to conditions of combinations composed of the voltage value, applying period and number of applying times of the signal A.

Next, the Vgl value is decreased while the liquid crystal panel is turned on, and a voltage, at which the whole liquid crystal panel is smoky white, is plotted. That the liquid crystal panel is smoky white means that the TFT 4 is not completely turned off. Namely, this can be regarded as an unsatisfactory operation of the picture element 46 due to a defect of the TFT 4, namely, the TFT characteristic is deteriorated.

Therefore, the various conditions of combinations composed of the voltage value, applying period and the number of applying times of the signal A may be set as follows. Namely, the plotted voltage may be set so as not to be smaller than the normal driving voltage value of the liquid crystal panel, namely, so as to be larger than the normal driving voltage value.

As to the potential difference of the signal A, more specifically, it is preferable that a gate potential difference (Vgh−Vgl), for example, falls within the range of four to five times the potential difference of the normal driving voltage of the liquid crystal panel. It is not preferable that the gate potential difference (Vgh−Vgl) exceeds five times the potential difference of the normal driving voltage because the characteristic of each TFT 4 is deteriorated.

It is not preferable that the gate potential difference (Vgh−Vgl) is smaller than four times the potential difference of the normal driving voltage, because sufficient stress cannot be applied to the insulating film 9 between the gate line 1 and the source line 2 on the liquid crystal panel. Moreover, taking a number of the inspecting steps into account, it is preferable that the applying period is one second, and the number of applying times is once.

The following explains a changing operation of the switches at the time of the S-G debug in the inspecting circuit shown in FIG. 4. Namely, when the liquid crystal panel is put into the oven, the switch 28 selects the terminal 28*b*. Therefore, the gate line signal is applied from the gate line signal generating circuit 20 to the gate line 1, and thus the inspecting pulse a is applied to the gate line 1.

In addition, in the case where an inspecting pulse for the S-G debug is applied, the switch 28 selects the terminal 28*a*, and the debug detecting signal A is applied from the debug detecting signal generating circuit 19 to the gate line 1. At this time, the switches 23, 26 and 27 may be connected to any terminals. In this state, the respective signals are applied to the gate line 1 for a predetermined period. As a result, the insulating film 9, which is on the verge of breakage, between the gate line 1 and the source line 2 is broken completely.

In such a manner, when the S-G debug, in which the overvoltage applying method and the high-temperature current-carrying light aging method are used at the same time, is completed, the liquid crystal panel is inspected for turning-on. At this time, a possible defect which will lead to an S-G leak, which was not detected by the conventional method of detecting a possible defect, can be detected as a cross bright line.

In the inspection for turning-on in the panel inspecting process, a place where the S-G leak occurs, a point defect, etc. can be detected by a highly accurate image processing apparatus. As a result, since the inspection can be made by a machine instead of personnel, personnel saving and simplification in the process are realized, and thus the oven can be introduced into the process for inspecting liquid crystal panel.

In addition, in the step P1 of inspecting a panel, the signal A is applied to the gate line 1, and at the same time when the switch 25 selects the terminal 25*a*, the debug detecting signal A is applied from the debug detecting signal generating circuit 19 to the Cs line 3. As a result, also the signal A is applied to the Cs line 3. This breaks also the insulating film 9, which is on the verge of breakage, between the source line 2 and the Cs line 3 completely, and thus a possible defect which would develop into a leak between the picture element electrode 11 and the Cs line 3 can be also detected in the inspection for turning-on.

Thereafter, only satisfactory liquid crystal panels which were subject to the panel inspecting step (P1) are mounted to a module (P2), and the defect inspection is completed after the module inspecting step (P3), and then finished products are shipped. In the conventional module inspecting step, S-G debug by the high temperature current-carrying light aging method was executed, but in the present invention, the above inspecting step can be omitted.

As mentioned above, in accordance with the method of inspecting a defect of the liquid crystal panel according to the present embodiment, at the panel inspecting step, the liquid crystal panel is maintained under the high temperature condition for constant period with the inspecting pulse a being applied to the gate line 1 of the liquid crystal panel, and at the same time, the signal A, which has a larger potential difference than the inspecting pulse a, is applied to the gate line 1 temporarily. As a result, stress is applied to the insulating layer 9 between the gate line 1 and the source line 2 so that the insulating layer 9 which is on the verge of breakage is broken completely, and a possible defect that would become an S-G leak is detected. Therefore, accuracy of detecting a possible defect leading to an S-G leak is improved, and a number of S-G leaks in the market can be decreased greatly.

In addition, in the conventional manner, the inspecting method is divided into the panel inspecting step and the module inspecting step so that S-G debug is executed by the overvoltage applying method and the high temperature current-carrying light aging method. However, according to the method of the present invention, compared with the conventional inspecting method, only one S-G debug is required, thereby shortening the total time required for inspecting a defect.

Furthermore, in the case where the liquid crystal panel to be subject to the inspection is a Cs-on-Common-type liquid crystal panel, the signal A is applied to the gate line 1, and at the same time the signal A is applied also to the Cs line 3. As a result, not only the S-G leak but also a possible defect to be a leak between the source line 2 and the Cs line 3 can be detected. Therefore, the occurrence of unsatisfactory display due to a liquid crystal panel in the market can be further suppressed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of detecting a possible defect of a liquid crystal panel provided with a substrate which has active elements for driving picture elements with liquid crystal, first signal lines and second signal lines which intersect each other and control the active elements, and an insulating layer provided between the first signal lines and the second signal lines, said method comprising the steps of:

applying stress to the insulating layer while retaining said liquid crystal panel under a high temperature condition for the active elements and while said liquid crystal panel is being energized by a first inspecting pulse having (a) a switching pulse which controls activation of the active elements via said second signal lines and (b) a driving pulse for applying an inspecting voltages which drives the picture elements, to the active elements via said first signal lines, the high temperature condition being a temperature in the range from above room temperature up to an upper limit of a mesomorphic range of the liquid crystal; and temporarily applying a second inspecting pulse to the active elements via said first signal lines and said second signal lines while the stress is being applied to the insulating layer, said second inspecting pulse having a driving pulse and a debug switching pulse with a larger potential difference than the switching pulse.

2. The method of detecting a possible defect of the liquid crystal panel according to claim 1, wherein a potential difference between said driving pulse and said debug switching pulse of the second inspecting pulse is set between a voltage value at which the active elements break and a normal driving voltage value of the active elements.

3. The method of detecting a possible defect of the liquid crystal panel according to claim 1, wherein said substrate further includes an auxiliary capacity line which is insulated from at least one of said first signal lines and the second signal lines by said insulating layer, said method further comprising the step of applying the second inspecting pulse to said auxiliary capacity line.

4. The method of detecting a possible defect of the liquid crystal panel according to claim 1, wherein the potential difference between said driving pulse and said debug switching pulse of the second inspecting pulse falls within the range of four to five times a normal driving voltage of the active elements.

5. The method of detecting a possible defect of the liquid crystal panel according to claim 1, wherein the high temperature condition is a temperature range between 40° C. and 80° C.

6. The method of detecting a possible defect of the liquid crystal panel according to claim 1, wherein the high temperature condition is a temperature range between 50° C. and 70° C.

7. The method of detecting a possible defect of the liquid crystal panel according to claim 1, wherein each of the active elements is a TFT having a gate terminal, a source terminal and a drain terminal.

8. The method of detecting a possible defect of the liquid crystal panel according to claim 7, wherein said first signal lines apply said driving pulse to the source and the second signal lines apply said switching pulse to the gate.

9. The method of detecting a possible defect of the liquid crystal panel according to claim 7, wherein the first inspecting pulse includes a switching pulse applied to the gate via said second signal lines for turning on the TFT and a driving pulse applied to the source via said first signal lines.

10. The method of detecting a possible defect of the liquid crystal panel according to claim 9, wherein the debug switching pulse of said second inspecting pulse is applied to the gate instead of the switching pulse of the first inspecting pulse, the debug switching pulse having a larger potential difference than the switching pulse applied to the gate by said first inspecting pulse.

11. An apparatus for detecting a possible defect of a liquid crystal panel provided with a substrate which has active elements for driving picture elements with liquid crystal, first signal lines and second signal lines which intersect each other and control the active elements, and an insulating layer provided between the first signal lines and the second signal lines, said apparatus comprising:

means for applying stress to the insulating layer while said liquid crystal panel is being energized by a first inspecting pulse and while said panel is retained under a high temperature condition for the active elements, said first inspecting pulse having (a) a switching pulse which controls activation of the active elements via said second signal lines and (b) a driving pulse for applying an inspecting voltage, which drives the picture elements, to the active elements via said first signal lines, and wherein said high temperature condition is a temperature in the range from above room temperature up to an upper limit of a mesomorphic range of the liquid crystal; and means for temporarily applying a second inspecting pulse to the active elements via said first signal lines and second signal lines while stress is being applied to the insulating layer, said second inspecting pulse having a driving pulse and a debug switching pulse having a larger potential difference than the switching pulse.

12. The apparatus of claim 11, wherein the debug switching pulse of said second inspecting pulse is set so that a voltage value at which the active elements are broken becomes larger than a normal driving voltage value of said liquid crystal panel.

13. The apparatus of claim 11, wherein said substrate further includes an auxiliary capacitance line which is insulated from at least one of said first signal lines and the second signal lines by said insulating layer, said apparatus further comprising means for applying the debug switching pulse of said second inspecting pulse to said auxiliary capacitance line.

14. The apparatus of claim 11, wherein a potential difference of the debug switching pulse falls within the range of four to five times a normal driving voltage value of said liquid crystal panel.

* * * * *